United States Patent [19]

Ohuchi

[11] Patent Number: 4,678,537
[45] Date of Patent: Jul. 7, 1987

[54] METHOD OF MANUFACTURING SEMICONDUCTOR DEVICES

[75] Inventor: Norikazu Ohuchi, Kanagawa, Japan

[73] Assignee: Sony Corporation, Tokyo, Japan

[21] Appl. No.: 865,295

[22] Filed: May 21, 1986

[30] Foreign Application Priority Data

May 23, 1985 [JP] Japan ................................ 60-111249
May 23, 1985 [JP] Japan ................................ 60-111250
May 23, 1985 [JP] Japan ................................ 60-111251

[51] Int. Cl.[4] ...................... H01L 21/306; B44C 1/22; C03C 15/00; C03C 25/06
[52] U.S. Cl. .............................. 156/643; 29/576 W; 29/591; 148/1.5; 148/187; 156/644; 156/646; 156/653; 156/657; 156/662; 156/661.1; 427/93; 357/34; 357/59; 357/91
[58] Field of Search .................... 148/1.5, 187, 190; 29/571, 576 B, 576 W, 591; 156/643, 644, 646, 653, 657, 659.1, 661.1, 662; 427/85, 86, 88, 93, 94; 357/34, 40, 41, 43, 49, 59, 91

[56] References Cited

U.S. PATENT DOCUMENTS

4,239,559 12/1980 Ito .................................. 156/662 X

Primary Examiner—William A. Powell
Attorney, Agent, or Firm—Vorys, Sater, Seymour & Pease

[57] ABSTRACT

To reduce the parasitic capacitance due to the graft base area in a transistor device and to miniaturize the device, the graft base area is connected to a conductive layer to be connected to the base electrode through a minute gap of about 1,000 Å. This minute gap can be formed by leaving an oxide resistant layer (1,000 Å) at the side wall portion of the conductive layer of which peripheral portion is perpendicular to the surface of the base area by applying an isotropic etching technique and by removing the remaining oxide resistant layer on the basis of selective etching technique, after thermal oxidation of the device with masking the side wall portion by the remaining oxide resistant layer.

20 Claims, 29 Drawing Figures

METHOD OF MANUFACTURING SEMICONDUCTOR DEVICES

BACKGROUND OF THE INVENTION

The present invention relates generally to a method of manufacturing semiconductor devices, and more particularly to a method of manufacturing a minute gap area for connecting an active area of the semiconductor device to a conductive layer to be connected to an electrode in order to reduce the element parasitic capacitance and simultaneously miniaturize the semiconductor device element.

DESCRIPTION OF THE PRIOR ART

The background of the present invention will be explained hereinbelow with respect to its application to bipolar LSIs.

Recently, the pattern of bipolar LSIs has been miniaturized more and more and the conjunction areas therein has been reduced narrower and narrower to realize higher speed bipolar LSIs. To reduce the base width in bipolar transistors, shallower diffusion is required for both the base and emitter. Therefore, boron is usually ion-injected for base diffusion and arsenic is diffused from an As dopped polycrystal silicon to the emitter. Further, elements are separated from each other by oxide films to reduce stray capacitances. As an example of these transistors, it is possible to give LOCOS (Local Oxidation of Silicon) transistors.

In LOCOS transistors, however, since the intrinsic base and the graft base are formed separately so as to have a space required for mask fitting processes and therefore the non-active areas are relatively large as compared with the active areas, relatively great parasitic capacitance and resistance are inevitably produced. Thus, there exists a problem in that the high speed operation of the transistor is limited.

To overcome these problems, an improved LOCOS transistor has been proposed, in which a polycrystal silicon conductive film is used for connecting the active base area and the base electrode in order to reduce the parasitic capacitance. In these improved transistors, however, as the stripe width of the emitter has been miniaturized, the width of the graft base area becomes wider and wider as compared with that of the intrinsic base area. the reasonis as follows: Since this graft base area is usually formed by diffusion from a polycrystal silicon at heat treatment and connected to the intrinsic area, a mask fitting space is required in addition to the width required for the connection. Therefore, it is impossible to sufficiently reduce the width of the emitter stripe. In other words, there still exists a problem in that the parasitic capacitance due to the graft base area is relatively large with decreasing width of the emitter stripe.

The arrangement of the prior art semiconductor devices will be described in further detail hereinafter with reference to the attached drawings under the detailed description of the preferred embodiments.

SUMMARY OF THE INVENTION

With these problems in mind, therefore, it is the primary object of the present invention to provide a method of manufacturing a semiconductor device by which a minute gap (about 1,000 Å) can be formed on the surface of an active area for connecting the active area to a conductive layer connected to an external electrode of the device in alignment with the active area in order to eliminate the mask fitting space or to reduce the parasitic capacitance. Since the semiconductor device manufactured in accordance with the present invention is small both in parasitic capacitance and resistance, it is possible to manufacture high speed and highly integrated LSIs.

To achieve the above-mentioned object, the method of manufacturing the semiconductor device according to the present invention comprises the following steps of: (a) forming a first insulating layer on a semiconductor substrate including at least one active area; (b) selectively forming a first conductive layer on the first insulating layer; (c) forming a second insulating layer on the selectively formed first conductive layer; (d) forming at least one active area window through the first and second insulating layers and the first conductive layer on the active area perpendicular to a surface of the semiconductor device; (e) forming a third insulating layer on the active area exposed through the active area window; (f) forming an oxide resistant layer all over the semiconductor substrate; (g) anisotropicly etching the oxide resistant layer so as to leave the oxide resistant layer only at a part of a side wall of the active area window; (h) oxidizing the semiconductor substrate by masking the remaining oxide resistant layer to change the third insulating layer to a fourth insulating layer; and (i) selectively etching the remaining oxide resistant layer and the third insulating layer just under the remaining oxide resistant layer to form a minute gap on the surface of the active area for connecting the active area to the first conductive layer to be connected to an electrode of the semiconductor device.

In summary, in the method according to the present invention, a window is formed on an active area; an oxide resistant film is formed all over the substrate; an anisotropic etching is effected to leave the oxide resistant film (corresponding to the minute gap) only at a part of side wall of the formed window; the other surface is oxidized by masking the remaining oxide resistant film; and the remaining oxide resistant film is removed by etching, without use of any mask, to form a minute gap on the active layer surface.

Since the thickness of this minute gap can be determined based upon that of the oxide resistant film, it is possible to form a gap as minute as 1,000 Å ($10^{-7}$ m).

Thereafter a polycrystal film is formed and an impurity is ion-injected thereinto to form a graft active area in dependene upon the diffusion of the impurity within the polycrystal film to the active aea due to heat treatment.

Further, after having left the polycrystal film (semiconductor layer including the impurity) at the minute gap on the active area so as to be connected to the external electrode, ion-injection is effected to form an intrinsic active area.

According to the method of the present invention, since it is possible to markedly reduce the space of the graft active area, the parasitic capacitance can be reduced markedly and therefore high speed, high integrated LSIs can be manufactured.

BRIEF DESCRIPTION OF THE DRAWINGS

The features and advantages of the method of manufacturing a semiconductor device according to the present invention over te prior art method will be more clearly appreciated from the following description of the preferred embodiments taken in conjunction with the accompanying drawings in which like reference numeral designate the same or similar elements or sections throughout the figures thereof and in which.

DETAILED DESCRIPTION OF THE PREFERRED EMBODIMENTS

To facilitate an understanding of the present invention, a brief reference will be made to prior art semiconductor devices with reference to the attached drawings.

In order to operate a bipolar LSI (two carriers of electron and hole coexist for active operation) at higher speed, it is necessary to make the base width as narrow as possible. To reduce the base width, shallow base and emitter diffusions are indispensable. Further, boron is ion-injected for base diffusion and arsenic (As) is diffused from As-dopped polycrystal silicon for emitter diffusion. In usual, oxide films are provided between device elements to reduce each stray capacitance. A first typical example of transistors as described above is a LOCOS (Local Oxidation of Silicon) transistor as shown in FIG. 1A, in which an intrinsic base and a graft base are formed separately so as to enable mask fitting process.

Figure 1A:
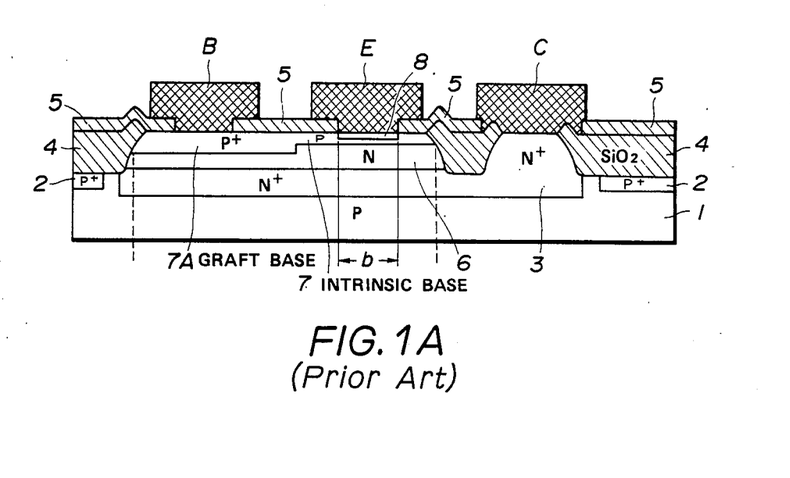
FIG. 1A is a diagrammatic cross-sectional view showing a prior art LOCOS transistor.

In more detail, in FIG. 1A, the reference numeral 1 denotes a P-type substrate; 2 denotes a P+ channel stopper layer; 3 denotes a N+ collector layer; 4 denotes a $SiO_2$ film; 5 denotes a $SiO_2$ film; 6 denotes an N-type layer; 7 denotes an intrinsic base area; 7A denotes a graft base area; and 8 denotes an emitter area. Further, the reference symbol B designates a base electrode; E designates an emitter electrode; and C designates a collector electrode.

As is well understood with reference to FIG. 1A, the cross-sectional area of the non-active area is relatively large as compared with that of the active area. Thus, there exist shortcomings such that it is impossible to operate the transistor at high operation speed due to the presence of parasitic capacitances or resistances.

Figure 1B:
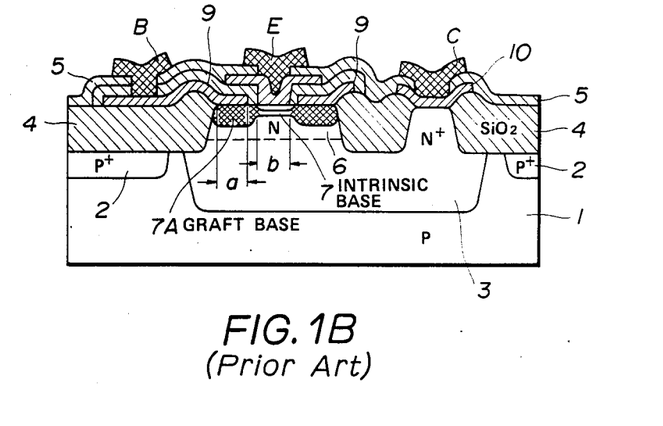
FIG. 1B is a diagramatic cross-sectional view showing a prior art improved LOCOS transistor.

FIG. 1B shows an improved LOCOS transistor, in which polycrystal conductive silicon layers 9 and 10 are additionally formed to connect the active areas to the corresponding external electrodes, so that the parasitic capacitances can be reduced.

In more detail, in FIG. 1B, a first polycrystal conductive silicon layer 9 is connected between the base area 6 of the N-type epitaxial layer and the base electrode B and a second polycrystal conductive silicon layer 10 is connected between the collector area 3 of the N+ buried layer and the collector electrode C. In such a structure as described above, although it is possible to relatively reduce the parasitic capacitance or resistor, there still exist shortcomings in that the width a of the P+ layer 7, that is, the graft base area connected to the base electrode B becomes relatively large, as compared with the width b of the P+ layer 7, that is, the intrinsic base area, with decreasing width of the emitter stripe. This graft base area 7A is usually formed by diffusing impurity included in the polycrystal conductive silicon layer 9 thereinto and then connected to the instrinsic region 7. In this graft area 7A, a space for mask fitting is required in addition to the space (width) for connection with the polycrystal conductive silicon layer 9 to be connected to the base electrode B. Therefore, there still exists a problem in that it is impossible to sufficiently reduce the width a of this graft area 7A.

Since the emitter stripe width has been reduced more and more, the magnitude of parasitic capacitance caused by the graft base area has become a severe problem.

Further, in FIG. 1B it should be noted that another polycrystal silicon conductive layer 10 is formed under the collector electrode C. The presence of this layer 10 also causes to produce a parasitic capacitance.

In view of the above description, reference is now made to a first embodiment of the method of manufacturing a semiconductor device according to the present invention in accordance with the manufacturing process sequence of an NPN transistor by way of example.

The manufacturing process sequence can roughly be divided into three groups. The first group is from process A to process E for forming a minute gap (1,000 Å) on the base area in alignment with the active base and emitter area. The second group is from process F to process H for forming a graft base area under the minute gap and an intrinsic base area while connecting the graft base area to the base electrode. The third group is from process I to process O for forming an emitter area and completing the semiconductor device.

These processes will be described in further detail in order with reference to the attached drawings.

Figure 2A:
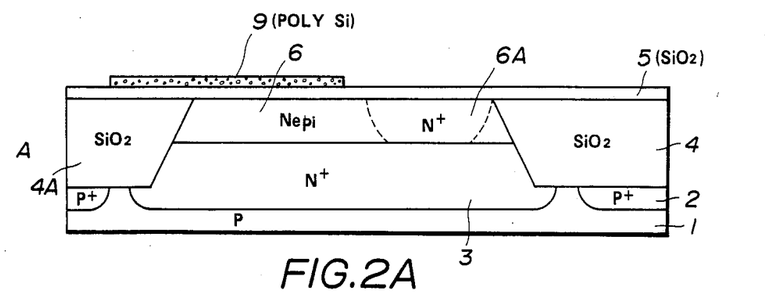
FIG. 2A is a diagrammatic cross-sectional view showing an NPN transistor for assistance in explaining the process A of the first embodiment of the method according to the present invention.

PROCESS A (FIG. 2A)

In a basic P-type substate 1, a P+ channel stopper 2 and an N+ buried layer 3 are formed. An N-type epitaxial layer 6 is grown on the N+ buried layer. Oxidized films 4 and 4A are formed for isolation. An N+ collector electrode contact area 6A is formed in the N-type epitaxial layer 6. A first insulating layer such as a $SiO_2$ film 5 with a thickness of 3,000 Å ($3 \times 10^{-7}$ m) is grown all over the semiconductor substrate in accordance with CVD (Chemical Vapor Deposition) method. A first polycrystal conductive silicon layer 9 with a thickness of 1,500 Å ($1.5 \times 10^{-7}$ m) is formed on a part of the $SiO_2$ film 5 as depicted in FIG. 2A. This first polycrystal conductive silicon layer 9 is so formed as to become low in resistance by doping a P-type impurity, because this layer 9 is used for a base electrode contract layer to be connected to a base electrode after the device has completely been manufactured.

Figure 2B:
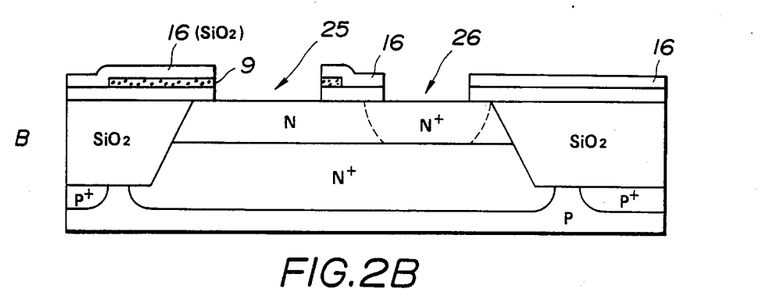
FIG. 2B is a similar view for assistance in explaining the process B thereof.

PROCESS B (FIG. 2B)

The first polycrystal conductive silicon layer 9 is photoetched to remove unnecessary areas. A second insulating layer such as a $SiO_2$ film 16 is formed thereupon in accordance with CVD method. An active area window 25 corresponding to the base and the emitter and an active area window 26 corresponding to the collector are formed in accordance with RIE (Reactive Ion Etching) method. In this process, it should be noted that the active area window 25 is formed perpendicular to the surface of the semiconductor device.

Figure 2C:
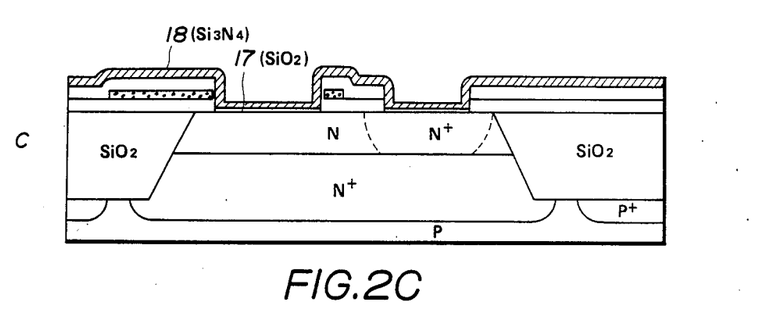
FIG. 2C is a similar view for asistance in explaining the process C thereof.

PROCESS C (FIG. 2C)

After a third thin insulating layer such as a $SiO_2$ film 17 with a thickness of 100 Å ($10^{-8}$ m) has been formed over the substrate in accordance with thermal oxidation, an oxide resistant layer such as a $Si_3N_4$ film 18 with a thickness of 1,000 Å ($10^{-7}$ m) is formed on the thin $SiO_2$ film 17 in accordance with CVD method as an oxide resistant film.

Figure 3A:
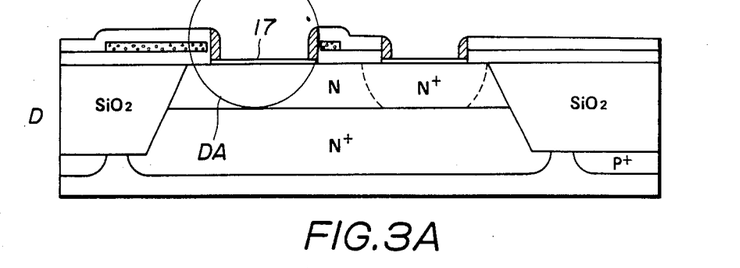
FIG. 3A is a similar view for assistance in explaining the process D thereof.
Figure 3B:
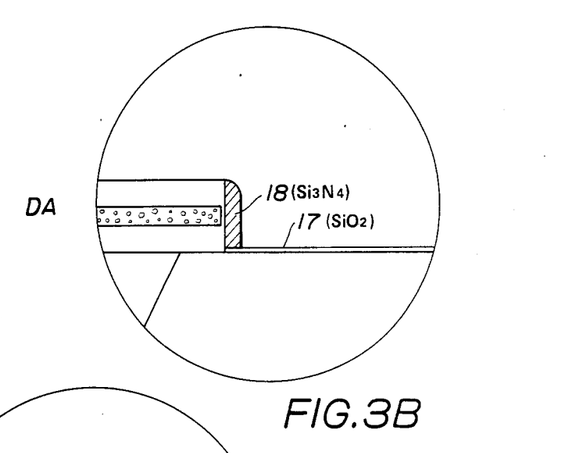
FIG. 3B is an enlarged similar view of FIG. 3A.

PROCESS D OR DA (FIG. 3A OR 3B)

The upper oxide resistant $Si_3N_4$ film 18 is anisotropicly etched in accordance with RIE method to leave the $Si_3N_4$ film 18 to form the side wall at the periphery of the window exposed to the active area 25 as depicted in FIG. 3A or 3B.

Figure 3C:
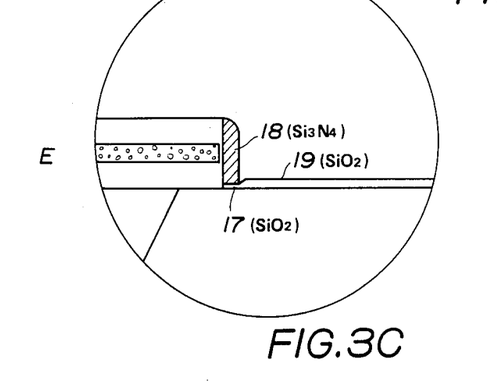
FIG. 3C is an enlarged similar view for assistance in explaining the process E thereof.
Figure 4A:
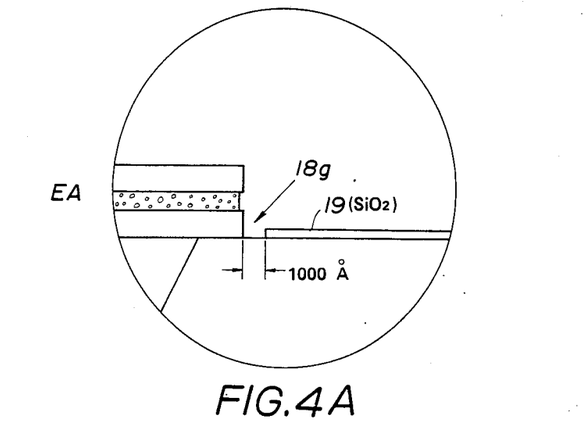
FIG. 4A is an enlarged similar view for assistance in explaining the process E thereof.

PROCESS E OR EA (FIG. 3C or 4A)

With masking a part of the active area 25 by the side wall (the $Si_3N_4$ film 18), thermal oxidation is effected to change the third insulating layer ($SiO_2$ film) 17 to a fourth insulating layer such as a $SiO_2$ film 19. In this process, the third 100 Å thick film 17 becomes the fourth 300 Å thick film 19. By selectively etching the $Si_3N_4$ film 18 and the 100 Å thick $SiO_2$ film 17 just under the $Si_3N_4$ film 18, a minute gap (18 g) with a width of 1,000 Å ($10^{-7}$ m) substantially equal to that of the $Si_3N_4$ film 18 is formed between the two oxide films 5 and 19 as depicted in FIG. 4A.

Figure 4B:
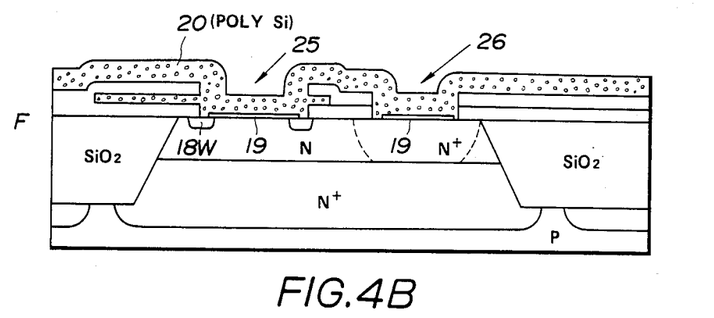
FIG. 4B is a similar view for assistance in explaining the process F thereof.

PROCESS F (FIG. 4B)

A second polycrystal conductive silicon layer 20 with a thickness of 2,000 Å ($2 \times 10^{-7}$ m) is formed all over the substrate in accordance with CVD method. By applying a photoresist (photosensitive film) thereupon, an opening is formed over the active area 25 (base and emitter regions) to ion-inject boron B. In the same way, an opening is formed over the corrector contact area 26 to ion-inject arsenic As. These impurities diffuse into the second polycrystal conductive silicon film 20 by a heat treatment at a relatively low temperature (800° C.), because the diffusion constant of each of these impurities is relatively large in polycrystal silicon. This diffused area is to be in contact with the silicon crystals of active areas; that is, to form a graft base area.

Figure 4C:
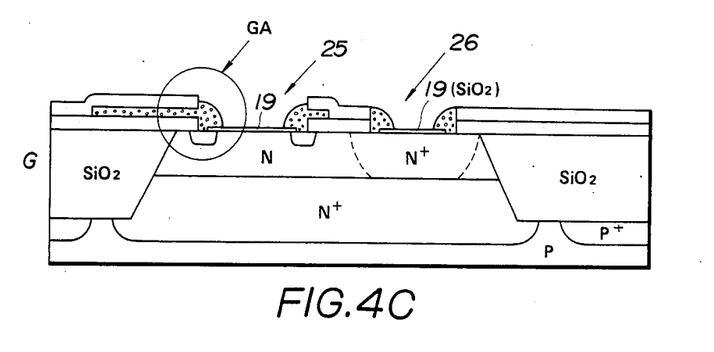
FIG. 4C is a similar view for assistance in explaining the process G thereof.
Figure 5A:
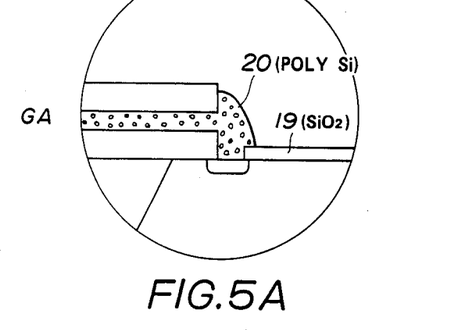
FIG. 5A is an enlarged similar view for assistance in explaining the process G thereof.

PROCESS G OR GA (FIG. 4C OR 5A)

The second polycrystal conductive silicon film 20 is etched in accordance with RIE method using a chroric gas to leave the polycrystal conductive silicon film 20 only at the side wall portions of the two windows 25 and 26 as depicted in FIG. 4C or 5A. Here, the thickness of this second remaining polycrystal silicon film 20 is larger than that of the oxide resistant layer ($Si_3N_4$ film) 18 formed in FIG. 2C.

Figure 5B:
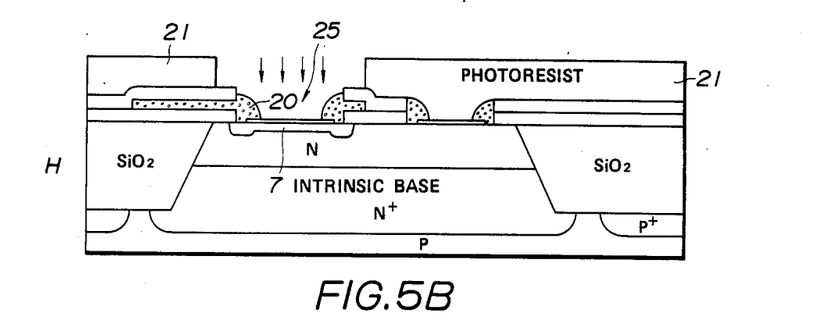
FIG. 5B is a similar view for assistance in explaining the process H thereof.

PROCESS H (FIG. 5B)

After a photoresist 21 has been applied to the area other than the window 25, ion injection is made by accelerating $BF_2$ up to 60 Kev to form intrinsic base area 7 in alignment with the second polycrystal conductive silicon film 20 formed in side wall state.

Figure 5C:
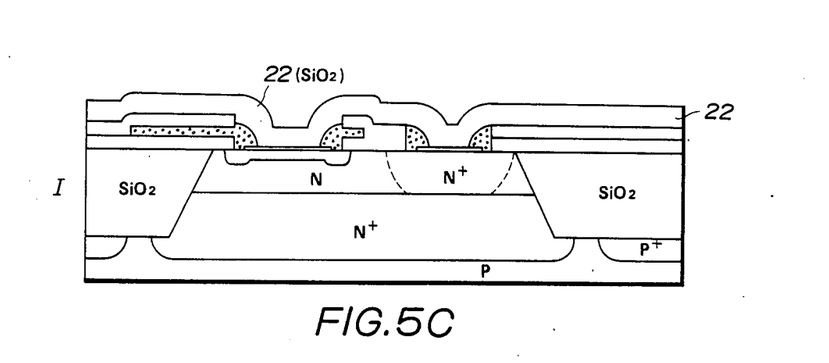
FIG. 5C is a similar view for assistance in explaining the process I thereof.

PROCESS I (FIG. 5C)

A fifth insulating layer such as a silicon oxide film 22 with a thickness of 3,000 Å ($3 \times 10^{-7}$ m) is formed over the substrate in accordance with CVD method.

Figure 6A:
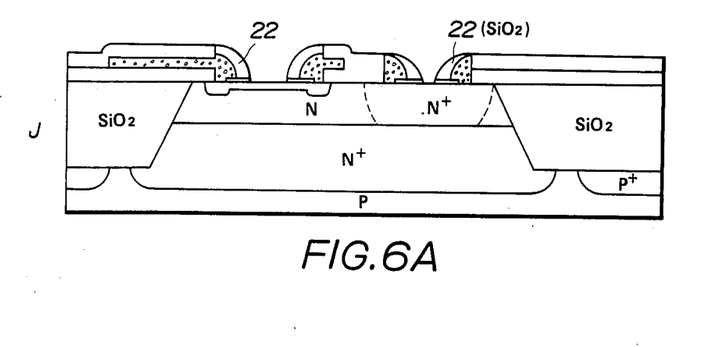
FIG. 6A is a similar view for assistance in explaining the process J thereof.

PROCESS J (FIG. 6A)

The uppermost $SiO_2$ film 22 is removed in accordance with RIE method to leave the film 22 in side wall state, as depicted in FIG. 6A.

Figure 6B:
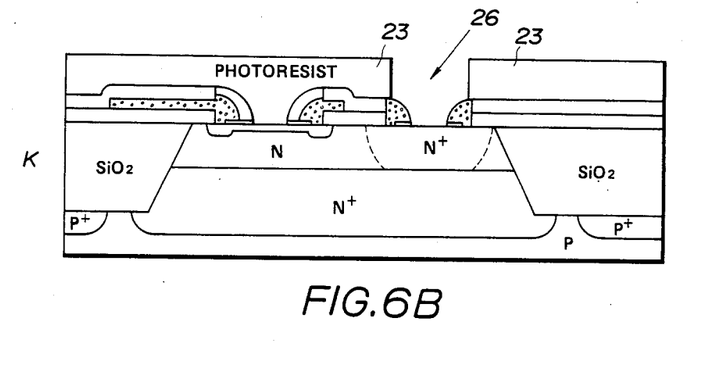
FIG. 6B is a similar view for assistance in explaining the process K thereof.

PROCESS K (FIG. 6B)

A photoresist is applied to the area except the collector contact area 26 to remove the fifth $SiO_2$ film 22 formed in the side wall state at the collector window 26 by etching.

Figure 6C:
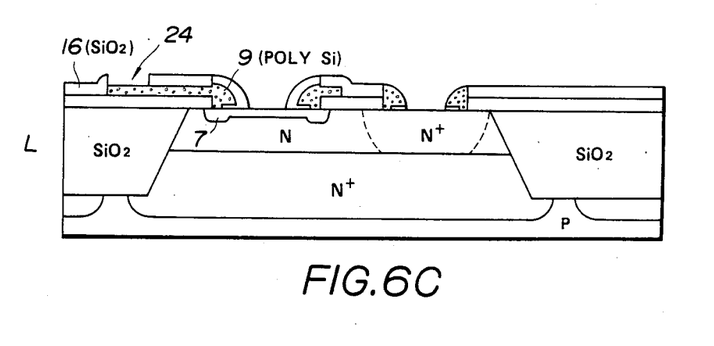
FIG. 6C is a similar view for assistance in explaining the process L thereof.

PROCESS L (FIG. 6C)

A window for a base contact area 24 is formed in the second insulating layer ($SiO_2$ film) 16 by photoetching method. In the case where the first polycrystal conductive silicon film 9 is used for resistors, this window 24 also serves as the contact area therefor.

Figure 7A:
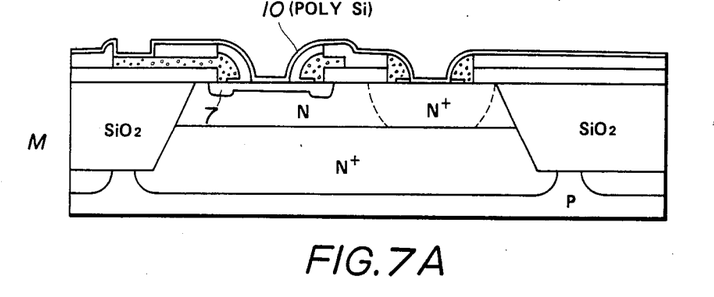
FIG. 7A is a similar view for assistance in explaining the process M thereof.

PROCESS M (FIG. 7A)

Another polycrystal silicon film 10 with a thickness of 1,000 Å ($10^{-7}$ m) is formed over the substrate in accordance with CVD method.

Figure 7B:
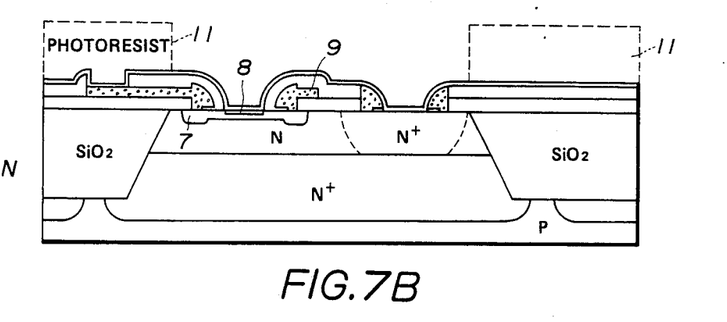
FIG. 7B is a similar view for assistance in explaining the process N thereof.

PROCESS N (FIG. 7B)

A photoresist 11 is applied as shown in FIG. 7B. An impurity As is ion-injected and diffused thereafter to form an emitter 8.

Figure 7C:
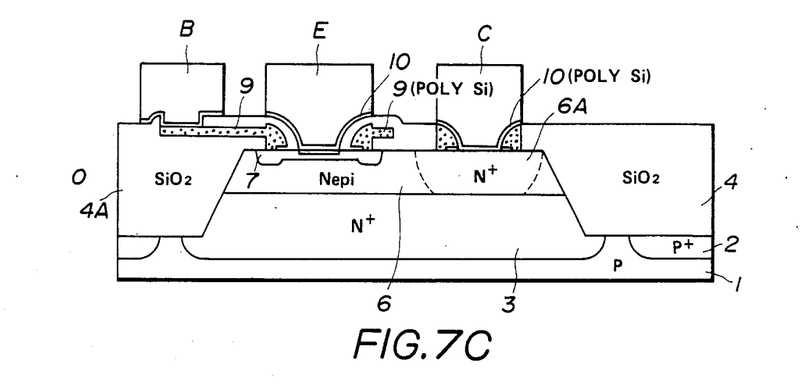
FIG. 7C is a similar view for assistance in explaining the process O thereof.

PROCESS O (FIG. 7C)

In the same way as in the conventional method, a base electrode B, an emitter electrode E and a collector electrode C are formed as shown in FIG. 7C.

The second embodiment of the method of manufacturing a semiconductor device according to the present invention will be described hereinbelow. In this embodiment, an additional polycrystal silicon film is formed under the oxide resistant $Si_3N_4$ film 18 in the process C shown in FIG. 2C.

Figure 8A:
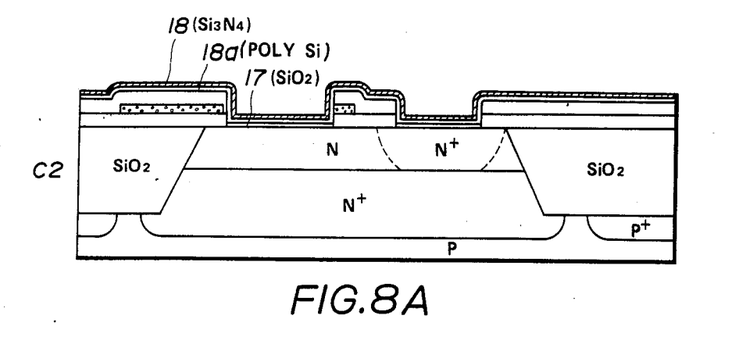
FIG. 8A is a diagrammatic cross-sectional view showing an NPN transistor for assistance in explaining the process C of the second embodiment of the method according to the present invention.

PROCESS C2 (FIG. 8A)

After the third insulating layer ($SiO_2$ film) 17 with a thickness of 50 Å ($5 \times 10^{-8}$ m) has been formed by thermal oxidation, a polycrystal silicon film 18a is additionally formed in accordance with CVD method, before forming the oxide resistant layer ($Si_3N_4$ film) 18 (1,000 Å).

Figure 8B:
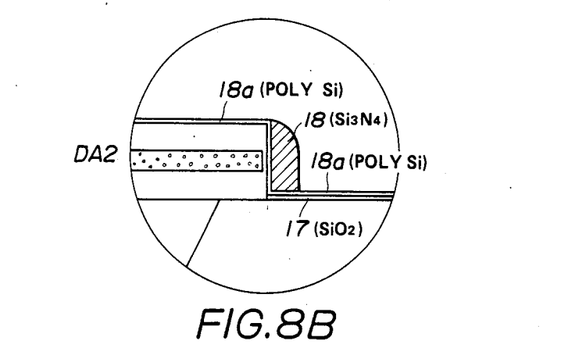
FIG. 8B is an enlarged similar view for assistance in explaining the process D thereof.

PROCESS DA2 (FIG. 8B)

The upper oxide resistant layer ($Si_3N_4$ film) 18 is etched in accordance with RIE method to leave the $Si_3N_4$ film 18 only at the side wall portion of the active area 25 as depicted in FIG. 8B.

Figure 8C:
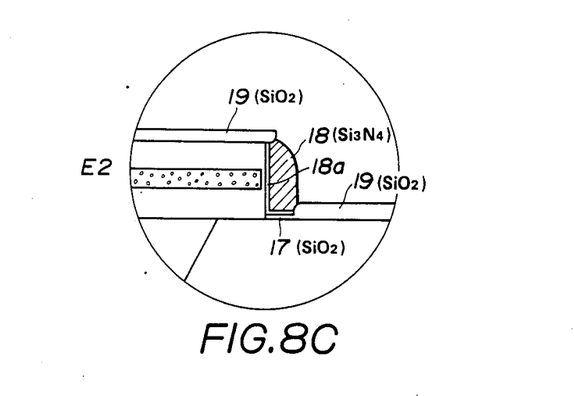
FIG. 8C is an enlarged similar view for assistance in explaining the process E thereof.

PROCESS E2 (FIG. 8C)

By masking the side wall portion of the active area 25 (the $Si_3N_4$ film 18), thermal oxidation is effected to change the polycrystal silicon film 18a and the third insulating layer ($SiO_2$ film) 17 to the fourth insulating layer ($SiO_2$ film) 19.

Figure 9A:
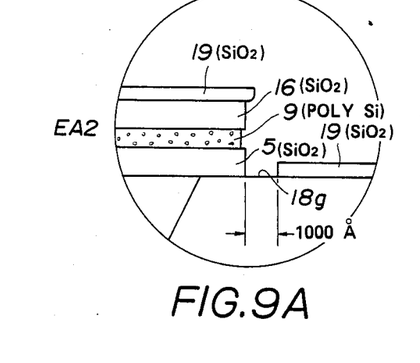
FIG. 9A is an enlarged similar view for assistance in explaining the same process E thereof.

Selectively (anisotropicly) etching the three films (the $Si_3N_4$ film 18, the polycrystal silicon film 18a and the $SiO_2$ film 17 under the remaining $Si_3N_4$ film 18), a minute gap 18g with a width of 1,000 Å ($10^{-7}$ m) substantially equal to that of the $Si_3N_4$ film 18 is formed between the two oxide films 5 and 19 as depicted in FIG. 9A.

PROCESS F2 (FIG. 4B)

The same as in the first embodiment.

Figure 9B:
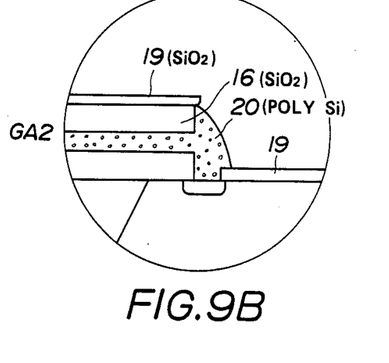
FIG. 9B is an enlarged similar view for assistance in explaining the process G thereof.

PROCESS G2 OR GA2 (FIG. 9B)

The second conductive polycrystal silicon film 20 is etched in accordance with RIE method using a chroric gas to leave the polycrystal silicon film 20 only at the side wall portions of the two windows 25 and 26. Further, if necessary, the fourth $SiO_2$ film 19 may be removed in accordance with RIE method. In this process, another film for stabilizing ion injection may be formed where necessary.

PROCESS H2 TO O2

The same as in the first embodiment.

The third embodiment of the method of manufacturing a semiconductor device according to the present invention will be described hereinbelow. In the process C of this third embodiment, an additional oxide resistant layer ($Si_2N_4$ film) 18b is further formed under the polycrystal silicon film 18a formed in the second embodiment. In other words, three films of $Si_3N_4$ film 18b, polycrytsal silicon film 18a and $Si_3N_4$ film 18 are formed on the $SiO_2$ film 17 formed by thermal oxidation in the process C.

Figure 10A:
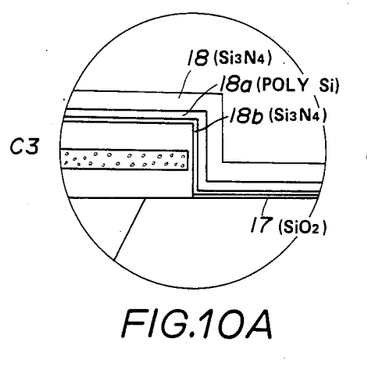
FIG. 10A is an enlarged diagrammatic cross-sectional view showing an NPN transistor for assistance in explaining the process C of the third embodiment of the method according to the present invention.

PROCESS C3 (FIG. 10A)

After the $SiO_2$ film 17 with a thickness of 50 Å ($5 \times 10^{-8}$ m) has been formed by thermal oxidation, a second $Si_3N_4$ film 18b is further formed between the thermooxidized $SiO_2$ film 17 and the polycrystal silicon film 18a as depicted in FIG. 10A.

Figure 10B:
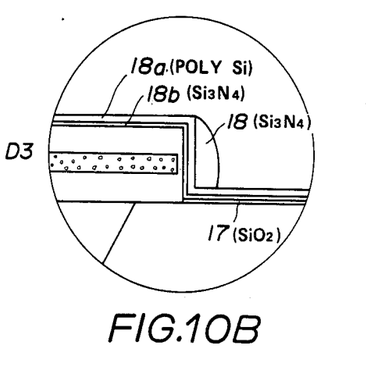
FIG. 10B is an enlarged similar view for assistance in explaining the process D thereof.

PROCESS D3 (FIG. 10B)

The uppermost $Si_3N_4$ film 18 is removed in accordance with RIE method to expose the polycrystal silicon film 18a and simultaneously leave the $Si_3N_4$ film 18 only at the side wall portion of the window 25.

Figures 10C, 10D:
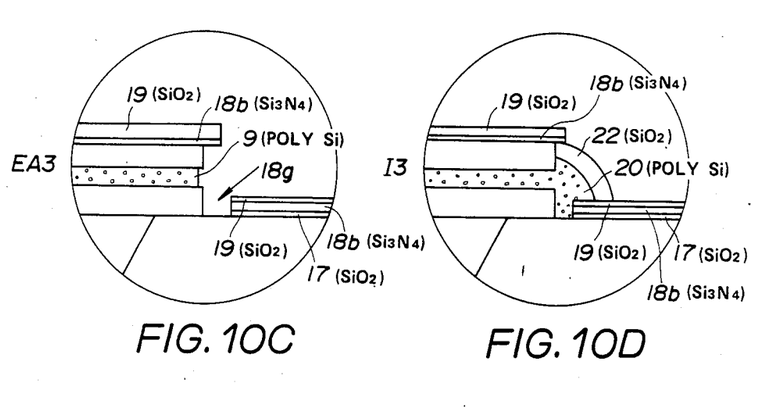
FIG. 10C is an enlarged similar view for assistance in explaining the process E thereof.
FIG. 10D is an enlarged similar view for assistance in explaining the process I thereof.

PROCESS EA3 (FIG. 10C)

By masking the side wall portion of the active area 25 (the $Si_3N_4$ film 18), thermal oxidation is effected to change the polycrystal silicon film 18 to the $SiO_2$ film 19.

Selectively etching the four films at the side wall portion (the $Si_3N_4$ film 18, the polycrystal silicon film 18a, the $Si_3N_4$ film 18b and the $SiO_2$ film 17 under the remaining $Si_3N_4$ film 18), a minue gap 18g with a width of 1,000 Å ($10^{-7}$ m) substantially equal to that of the $Si_3N_4$ film 18 is formed between the two oxide films 5 and 19 as depicted in FIG. 10C.

PROCESS F3 TO G3

The same as in the embodiment.

PROCESS H3

If necessary after removing the uppermost $SiO_2$ film 19, the intrinsic area is formed the same as in the first embodiment.

PROCESS I3 (FIG. 10D)

Without uniformly forming the $SiO_2$ film 22 as in the process I (FIG. 5C) of the first embodiment, only the surface of the polycrystal Si 20 formed in the side wall state is thermooxidized by masking the lowermost $Si_3N_4$ film 18b formed in the process C3 (FIG. 10A) to obtain the oxidized film 22 the same as obtained in the process J shown in FIG. 6A.

PROCESS J3

Exposed $Si_3N_4$ film 18b and $SiO_2$ film are removed and the openings for emitter area and coller electrode area are formed.

PROCESS K3 TO O3

The same as in the first embodiment.

The basic processes of the present invention such that a minute gap 18g with a width of about 1,000 Å is formed can be applied to other semiconductor devices such as Schottky barrier diode. In the case where a Schottky barrier is formed by the use of the 1,000 Å wide gap formed by the processes from A to E, it is possible to manufacture a Schottky barrier diode suitable for ultra-high frequencies.

As described above, in the method of manufacturing a semiconductor device according to the present invention, since the connection between the active (base) area and the conductive layer to be connected to the external (base) electrode can be made through a gap as minute as 1,000 Å ($10^{-7}$ m) on the basis of side-wall technique in alignment with the active (base) area, it is possible to markedly reduce the parasitic capacitance caused by the graft active (base) area other than the intrinsic active (base) area. Additionally, since no polycrystal silicon conductive layer 10 is provided as in the prior-art improved LOCOS transistor shown in FIG. 1B, it is possible to further reduce the parasitic capacitance as compared with the prior art semiconductor device. The reduction in parasitic capacitance and resistance permits LSIs to be miniaturized in higher integrated condition and to be operated at high speed.

What is claimed is:

1. A method of manufacturing a semiconductor device, which comprises the following steps of:
   (a) forming a first insulating layer on a semiconductor substrate including at least one active area;
   (b) selectively forming a first conductive layer on said first insulating layer;
   (c) forming a second insulating layer on said first conductive layer;
   (d) forming at least one window through said first and second insulating layers and said first conductive layer on said active area of which peripheral portion is perpendicular to a surface of said semiconductor substrate;
   (e) forming a third insulating layer on said active area exposed through said active area window;
   (f) forming an oxide resistant layer all over said semiconductor substrate;
   (g) anisotropicly etching said oxide resistant layer so as to leave said oxide resistant layer only at a side wall portion of said window;
   (h) oxidizing said semiconductor substrate with said remaining oxide resistant layer as a mask to change said third insulating layer to a fourth insulating layer; and
   (i) selectively etching said remaining oxide resistant layer and said third insulating layer just under said remaining oxide resistant layer to form a minute gap on the surface of said active area for connecting said active area to said first conductive layer to be connected to an electrode of said semiconductor device.

2. The method of manufacturing a semiconductor device as set forth in claim 1, which further comprises the following steps of:
   (j) forming a second conductive layer all over the semiconductor substrate so as to connect said first conductive layer an the exposed surface of said active area through said formed minute gap;
   (k) injecting an impurity to said second conductive layer selectively to diffuse said impurity to said semiconductor substrate so as to form a graft active area;
   (l) etching said second conductive layer so as to leave said second conductive layer only at said side wall portion of said windows; and
   (m) injecting an impurity into inside of said graft active area on said semiconductor substrate to form an intrinsic active area.

3. The method of manufacturing a semiconductor device as set forth in claim 2, which further comprises the following steps of:
   (n) forming a fifth insulating layer only an said side wall portions of said two active area windows;
   (o) etching said fifth insulating layer left on said second active area;
   (p) forming a first electrode window in said second insulating layer on said first conductive layer;
   (q) injecting an impurity to said intrinsic active area to form a third active area; and
   (r) forming electrodes on said formed active areas.

4. The method of manufacturing a semiconductor device as set forth in claim 1, wherein said first insulating layer is a 3,000 Å ($3\times10^{-7}$ m) thick silicon oxide film formed in accordance with chemical vapor deposition method in step (a).

5. The method of manufacturing a semiconductor device as set forth in claim 1, wherein said first conductive layer is a 1,500 Å ($1.5\times10^{-7}$ m) thick polycrystal silicon film including impurity and formed in accordance with chemical vapor deposition method in step (b).

6. The method of manufacturing a semiconductor device as set forth in claim 1, wherein said second insulating layer is a silicon oxide film formed in accordance with chemical vapor deposition method in step (c).

7. The method of maufacturing a semiconductor device as set forth in claim 1, wherein said at least one window is formed in accordance with reactive ion etching method in step (d).

8. The method of manufacturing a semiconductor device as set forth in claim 1, wherein said third insulating layer is a 100 Å ($10^{-8}$ m) thick silicon oxide film in step (e).

9. The method of manufacturing a semiconductor device as set forth in claim 1, wherein said oxide resistant layer is a 1,000 Å ($10^{-7}$ m) thick $Si_3N_4$ film formed in accordance with chemical vapor deposition method in step (f).

10. The method of manufacturing a semiconductor device as set forth in claim 1, wherein said oxide resistant layer is composed of a 2,000 Å ($2\times10^{-7}$ m) thick polycrystal silicon film formed in accordance with chemical vapor deposition method and a 1,000 Å ($10^{-7}$ m) thick $Si_3N_4$ film formed on said polycrystal silicon film in step (f).

11. The method of manufacturing a semiconductor device as set forth in claim 1, wherein said oxide resistant layer is composed of a first $Si_3N_4$ film, a polycrystal silicon film formed on said first $Si_3N_4$ film and a second $Si_3N_4$ film formed on said polycrystal silicon film in step (f).

12. The method of manufacturing a semiconductor device as set forth in claim 1, wherein said oxide resistant layer is anisotropicly etched in accordance with reactive ion etching method in step (g).

13. The method of manufacturing a semiconductor device as set forth in claim 1, wherein said third and fourth insulating layers are silicon oxide films, said third silicon oxide film being thermooxidized into said fourth silicon oxide film in step (h).

14. The method of manufacturing a semiconductor device as set forth in claim 2, wherein said second conductive layer is a 2,000 Å ($2\times10^{-7}$ m) thick polycrystal silicon conductive film including an impurity formed in accordance with chemical vapor deposition method in step (j).

15. The method of manufacturing a semiconductor device as set forth in claim 2, wherein said impurity included in said second conductive layer are diffused to said active area to form said graft active area by low temperature heat treatment at about 800° C. in step (k).

16. The method of manufacturing a semiconductor device as set forth in claim 2, wherein said second conductive layer is etched in accordance with reactive ion etching method using a chroric gas in step (l).

17. The method of manufacturing a semiconductor device as set forth in claim 2, wherein said impurity is ion-injected B by accelerating said $BF_2$ up to 60 Kev in step (m).

18. The method of manufacturing a semiconductor device as set forth in claim 3, wherein said fifth insulating layer is a 3,000 Å ($3 \times 10^{-7}$ m) thick silicon oxide film formed by chemical vapor deposition method in step (n).

19. The method of manufacturing a semiconductor device as set forth in claim 3, wherein said fifth insulating layer is etched in accordance with reactive ion etching method in step (o).

20. The method of manufacturing a semiconductor device as set forth in claim 3, wherein said fifth insulating layer formed only on said side wall portion of said active area windows are formed by thermooxidizing a surface of said second conductive layer in steps (n).

* * * * *